(12) United States Patent
Ryu et al.

(10) Patent No.: US 8,692,109 B2
(45) Date of Patent: Apr. 8, 2014

(54) SOLAR CELL MODULE AND METHOD OF MANUFACTURING THE SAME, AND MOBILE APPARATUS WITH THE SOLAR CELL MODULE

(75) Inventors: Jin Mun Ryu, Gyeonggi-do (KR); In Taek Song, Gyeonggi-do (KR); Tae Young Kim, Seoul (KR); Seung Yun Oh, Gyeonggi-do (KR)

(73) Assignee: Samsung Electro-Mechanics Co., Ltd., Gyunggi-Do (KP)

( * ) Notice: Subject to any disclaimer, the term of this patent is extended or adjusted under 35 U.S.C. 154(b) by 106 days.

(21) Appl. No.: 13/015,079

(22) Filed: Jan. 27, 2011

(65) Prior Publication Data

US 2012/0055531 A1   Mar. 8, 2012

(30) Foreign Application Priority Data

Sep. 6, 2010  (KR) .................. 10-2010-0087122

(51) Int. Cl.
  *H02N 6/00*  (2006.01)
(52) U.S. Cl.
  USPC .......................................... 136/251; 136/244
(58) Field of Classification Search
  USPC .................................. 136/243–265
  See application file for complete search history.

(56) References Cited

U.S. PATENT DOCUMENTS

| | | | | |
|---|---|---|---|---|
| 6,395,972 B1 * | 5/2002 | Tran et al. | ...................... | 136/251 |
| 6,476,311 B1 * | 11/2002 | Lee et al. | ...................... | 136/244 |
| 2005/0000563 A1 * | 1/2005 | Nakayama et al. | ........... | 136/255 |
| 2006/0171698 A1 * | 8/2006 | Ryu et al. | ...................... | 396/114 |
| 2008/0178922 A1 | 7/2008 | Gibson et al. | | |
| 2009/0032087 A1 * | 2/2009 | Kalejs | ............. | 136/246 |
| 2009/0038671 A1 * | 2/2009 | Yamaguchi | .................... | 136/244 |
| 2009/0038679 A1 * | 2/2009 | Varghese et al. | .............. | 136/256 |
| 2009/0096082 A1 * | 4/2009 | Dutta | ............. | 257/700 |
| 2009/0103165 A1 * | 4/2009 | Kothari et al. | ................ | 359/290 |
| 2009/0194154 A1 * | 8/2009 | Takahashi et al. | ............. | 136/255 |
| 2009/0219273 A1 * | 9/2009 | Nathan et al. | ................. | 345/211 |
| 2010/0007019 A1 * | 1/2010 | Pendse | ............. | 257/737 |
| 2012/0012159 A1 * | 1/2012 | Ryu et al. | ...................... | 136/251 |

FOREIGN PATENT DOCUMENTS

| | | |
|---|---|---|
| CN | 101452970 A | 6/2009 |
| JP | 2001053299 | 2/2001 |
| JP | 2002094087 | 3/2002 |
| JP | 2006339601 | 12/2006 |

(Continued)

OTHER PUBLICATIONS

Vishay, Data Sheet for 3145 RTV Silicone Rubber, last revised Jan. 10, 2003, http://www.datasheetcatalog.org/datasheet/vishay/3145rtv.pdf.*

(Continued)

*Primary Examiner* — Alicia Bland
*Assistant Examiner* — Liesl C Baumann
(74) *Attorney, Agent, or Firm* — Lowe Hauptman & Ham, LLP

(57) ABSTRACT

The present invention provides a solar cell module including: a light transmitting plate having light transmittance; solar cells having bonding pads and conductive bumps bonded to the bonding pads; an adhesive film disposed between the light transmitting plate and the solar cells to bond the light transmitting plate and the solar cells; and a conductive pad disposed by being inserted in the adhesive film and surrounding and electrically connecting the conductive bumps of the adjacent solar cells.

12 Claims, 5 Drawing Sheets

(56) References Cited

FOREIGN PATENT DOCUMENTS

| | | |
|---|---|---|
| JP | 2009503870 | 1/2009 |
| JP | 2009147050 | 7/2009 |
| WO | WO 2009044996 A1 * | 4/2009 |

OTHER PUBLICATIONS

Applicant Admitted Prior Art, Figure 1, paragraphs [0004]-[0008].*
Chinese Office Action issued Sep. 16, 2013 in Chinese Application No. 201110095820.X.

* cited by examiner

10

- PRIOR ART -

SOLAR CELL MODULE AND METHOD OF MANUFACTURING THE SAME, AND MOBILE APPARATUS WITH THE SOLAR CELL MODULE

CROSS-REFERENCE TO RELATED APPLICATIONS

This application claims the benefit under 35 U.S.C. Section 119 of Korean Patent Application Serial No. 10-2010-0087122, entitled SOLAR CELL MODULE AND METHOD OF MANUFACTURING THE SAME, AND MOBILE APPARATUS WITH THE SOLAR CELL MODULE filed on Sep. 6, 2010, which is hereby incorporated by reference in its entirety into this application.

BACKGROUND OF THE INVENTION

1. Field of the Invention

The present invention relates to a solar cell module and a method of manufacturing the same, and a mobile apparatus with the solar cell module, and more particularly, to a solar cell module capable of improving bonding reliability of solar cells and reliability of electrical connection between the solar cells and a method of manufacturing the same, and a mobile apparatus with the solar cell module.

2. Description of the Related Art

General silicon solar cells can be classified into front and rear electrode structures according to the structure of electrodes. Solar cell modules having these front and rear electrode structures generally may have a chip on board (COB) or chip on glass (COG) type solar cell bonding structure.

FIG. 1 is a view showing an example of a mobile apparatus with a solar cell module in accordance with the prior art. Referring to FIG. 1, a mobile apparatus 10 may include a case 20 and a solar cell module 30 embedded in the case 20. Transparent glass 22, through which light is incident on the solar cell module 30, may be disposed at one side of the case 20. A display unit 24 may be disposed at the other side of the case 20 to display information to the outside.

The solar cell module 30 may be attached so that a light receiving surface thereof faces the transparent glass 22. The solar cell module 30 may have a COB or COG type solar cell module structure. For example, the solar cell module 30 has a structure with a printed circuit board (PCB) 32, solar cells 34 attached to one surface of the PCB 32, a bonding wire 36 connecting the solar cells 34 and the PCB 32, and a transparent molding film 38 covering the above components.

The mobile apparatus 10 having the above structure has a structure in which the transparent glass 22 and the solar cells 34 are bonded to each other with the transparent molding film 38 interposed therebetween. An adhesive (not shown) may be further interposed between the transparent glass 22 and the transparent molding film 38. At this time, the adhesive is usually formed only in some regions between the transparent glass 22 and the transparent molding film 38 to prevent light transmission loss. Accordingly, the mobile apparatus 10 having the above structure has a problem that bonding reliability of the solar cells 34 is low since adhesive strength of the solar cells 34 to the transparent glass 22 is low.

The mobile apparatus 10 having the above structure has a structure in which the solar cells 34 are electrically connected by a connection means such as the bonding wire 36. In general, since the bonding wire 36 has a structure weak to external shocks, the bonding wires 36, which are bent to be adjacent to each other, may be connected and shorted to each other when the transparent molding film 38 is formed. Therefore, the mobile apparatus 10 has a structure in which electrical connection between the solar cells 34 is low. In addition, since it requires a relatively large space to bend the bonding wire 36, in case of using the bonding wire 36, there is a limit to improvement of integration of the solar cells 34.

The mobile apparatus 10 having the above structure has a structure in which external light is incident on the solar cells 34 after sequentially passing through the transparent glass 22 and the transparent molding film 38. At this time, in case that a predetermined adhesive is interposed between the transparent glass 22 and the transparent molding film 38, the external light may be lost through at least three steps. Accordingly, the mobile apparatus 10 has a structure in which light transmittance to the solar cells 34 is low. This loss of incident light may be greatly generated in a process of passing through the transparent molding film 38. For example, in case of using a transparent epoxy resin as the transparent molding film 38, transmittance of the incident light may be reduced to less than 90%.

Further, there is a limit to the integration of the solar cells 34 having the above structure. For example, a total thickness of the solar cells 34 may be a total sum of thicknesses of the PCB 32, the solar cells 34, and the transparent molding film 38. However, since it is difficult to further improve the integration of the solar cells 34 having the above structure, it is difficult to meet a recent demand for the integration of the solar cell module.

SUMMARY OF THE INVENTION

The present invention has been invented in order to overcome the above-described problems and it is, therefore, an object of the present invention to provide a solar cell module capable of bonding reliability of solar cells to a light transmitting plate and a mobile apparatus with the same.

It is another object of the present invention to provide a solar cell module capable of improving reliability of electrical connection between solar cells and a mobile apparatus with the same.

It is still another object of the present invention is to provide a solar cell module capable of improving light incidence on solar cells and a mobile apparatus with the same.

It is still another object of the present invention is to provide a solar cell module with improved integration and a mobile apparatus with the same.

It is still another object of the present invention is to provide a method of manufacturing a solar cell module capable of improving bonding reliability of solar cells.

It is still another object of the present invention is to provide a method of manufacturing a solar cell module capable of improving reliability of electrical connection between solar cells.

It is still another object of the present invention is to provide a method of manufacturing a solar cell module capable of improving light incidence on solar cells.

It is still another object of the present invention is to provide a method of manufacturing a solar cell module with improved integration.

In accordance with one aspect of the present invention to achieve the object, there is provided a solar cell module including: a light transmitting plate having light transmittance; solar cells having bonding pads and conductive bumps bonded to the bonding pads; an adhesive film disposed between the light transmitting plate and the solar cells to bond the light transmitting plate and the solar cells; and a conductive pad disposed by being inserted in the adhesive film and surrounding and electrically connecting the conductive bumps of the adjacent solar cells.

In accordance with an embodiment of the present invention, the bonding pad may include a first bonding pad connected to a positive electrode of one of the solar cells and a second bonding pad connected to a negative electrode of the other solar cell adjacent to the one solar cell, the conductive bumps may include a first conductive bump bonded to the first bonding pad and a second conductive bump bonded to the second bonding pad, and the conductive pad may electrically connect the first conductive bump and the second conductive bump.

In accordance with an embodiment of the present invention, the conductive bump may include a stud bump.

In accordance with an embodiment of the present invention, the conductive bump may have a shape of one of a column and a horn whose cross section becomes smaller as going away from the solar cell.

In accordance with an embodiment of the present invention, the conductive bump may be used as a spacer for maintaining an interval between the light transmitting plate and the solar cells at a predetermined interval.

In accordance with an embodiment of the present invention, a total height of the conductive bump and the bonding pad may be equal to the predetermined interval between the light transmitting plate and the solar cell.

In accordance with an embodiment of the present invention, the solar cell may include a light receiving surface which receives light through the light transmitting plate and a non-light receiving surface opposite to the light receiving surface, and the solar cell module may further include a light reflective film which covers the non-light receiving surface.

In accordance with an embodiment of the present invention, the light transmitting plate may include an exposed surface exposed to the outside and an unexposed surface facing the light receiving surfaces of the solar cells, and the solar cell module may further include a molding film which covers the unexposed surface.

In accordance with an embodiment of the present invention, the molding film may be made of an opaque material.

In accordance with another aspect of the present invention to achieve the object, there is provided a mobile apparatus including: a case having an opening at one side; a display unit disposed at the other side of the case and displaying information to the outside; and a solar cell module disposed in the case and receiving and converting the external light into electric energy, wherein the solar cell module includes: a light transmitting plate disposed in the opening to seal the opening and having light transmittance; solar cells having bonding pads and conductive bumps bonded to the bonding pads; an adhesive film disposed between the light transmitting plate and the solar cells to bond the light transmitting plate and the solar cells; and a conductive pad disposed by being inserted in the adhesive film and surrounding and electrically connecting the conductive bumps of the adjacent solar cells.

In accordance with an embodiment of the present invention, the light transmitting plate may include transparent glass which is exposed outside the case and introduces external light into the solar cells.

In accordance with an embodiment of the present invention, the bonding pad may include a first bonding pad connected to a positive electrode of one of the solar cells and a second bonding pad connected to a negative electrode of the other solar cell adjacent to the one solar cell, the conductive bumps may include a first conductive bump bonded to the first bonding pad and a second conductive bump bonded to the second bonding pad, and the conductive pad may electrically connect the first conductive bump and the second conductive bump.

In accordance with an embodiment of the present invention, the conductive bump may have a shape of one of a column and a horn whose cross section becomes smaller as going away from the solar cell.

In accordance with an embodiment of the present invention, the conductive bump may be used as a spacer for maintaining an interval between the light transmitting plate and the solar cells at a predetermined interval.

In accordance with still another aspect of the present invention to achieve the object, there is provided a method of manufacturing a solar cell module including the steps of: preparing a light transmitting plate having light transmittance; preparing a film structure with an adhesive film having a conductive pad; preparing solar cells having bonding pads to which conductive bumps are bonded; attaching the adhesive film to the light transmitting plate while exposing the conductive pad; and bonding the solar cells to the light transmitting plate with the adhesive film interposed therebetween while pressing the conductive pad by the conductive bump to be inserted in the adhesive film.

In accordance with an embodiment of the present invention, the step of preparing the film structure may include the steps of disposing the conductive pad on a first adhesive film and attaching a second adhesive film to the first adhesive film to seal the conductive pad.

In accordance with an embodiment of the present invention, the step of preparing the film structure may include the steps of attaching a first protective film to one surface of the adhesive film and attaching a second protective film to the other surface of the adhesive film.

In accordance with an embodiment of the present invention, the step of preparing the film structure may include the steps of disposing the conductive pad on the first adhesive film, attaching the second adhesive film to the first adhesive film to seal the conductive pad; attaching the first protective film to one surface of the adhesive film, and attaching the second protective film to the other surface of the adhesive film, and the step of attaching the adhesive film to the light transmitting plate may include the steps of separating the first protective film from the first adhesive film, attaching the first adhesive film to the light transmitting plate, and separating the second adhesive film from the first adhesive film while leaving the conductive pad on the first adhesive film.

In accordance with an embodiment of the present invention, the step of separating the second adhesive film from the first adhesive film may be performed by increasing adhesive strength between the second adhesive film and the second protective film in comparison with adhesive strength between the first adhesive film and the second adhesive film so that the second adhesive film is separated from the first adhesive film together with the second protective film in a process of separating the second protective film from the film structure.

In accordance with an embodiment of the present invention, the adhesive strength between the first adhesive film and the second adhesive film may be adjusted to be greater than adhesive strength between the first protective film and the first adhesive film.

In accordance with an embodiment of the present invention, the step of bonding the solar cells to the light transmitting plate may include the step of relatively moving the light transmitting plate and the solar cells, and the conductive bump may be used as a stopper for stopping the relative movement of the light transmitting plate and the solar cells.

In accordance with an embodiment of the present invention, a stud bump may be used as the conductive bump.

In accordance with an embodiment of the present invention, the solar cell may include a light receiving surface which receives light through the light transmitting plate and a non-light receiving surface opposite to the light receiving surface, and the method of manufacturing a solar cell module may further include the step of forming a light reflective film which covers the non-light receiving surface.

In accordance with an embodiment of the present invention, the method of manufacturing a solar cell module may further include the step of forming a molding film of a non-light transmitting material which covers the solar cells.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
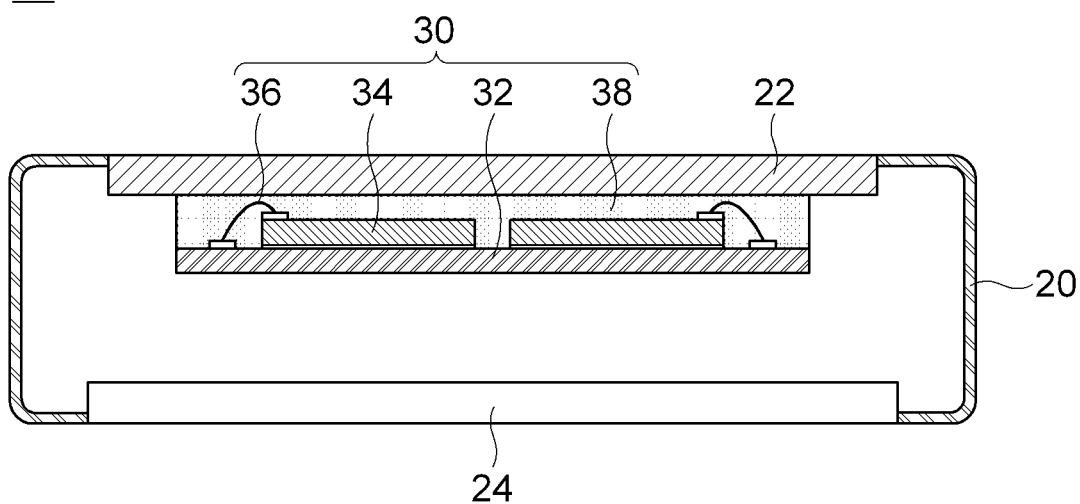
FIG. 1 is a view showing a mobile apparatus in accordance with the prior art.

Advantages and features of the present invention and methods of accomplishing the same will be apparent with reference to the following embodiments described in detail in conjunction with the accompanying drawings. However, the present invention is not limited to the following embodiments but may be embodied in various other forms. The embodiments are provided to complete the disclosure of the present invention and to completely inform a person with average knowledge in the art of the scope of the present invention. Like reference numerals refer to like elements throughout the specification.

Terms used herein are provided to explain embodiments, not limiting the present invention. Throughout this specification, the singular form includes the plural form unless the context clearly indicates otherwise. The terms "comprise" and/or "comprising" do not exclude the existence or addition of one or more different components, steps, operations, and/or elements.

Hereinafter, a solar cell module and a mobile apparatus with the same, and methods of manufacturing the solar cell module and the mobile apparatus in accordance with embodiments of the present invention will be described in detail with reference to the accompanying drawings.

Figure 2:
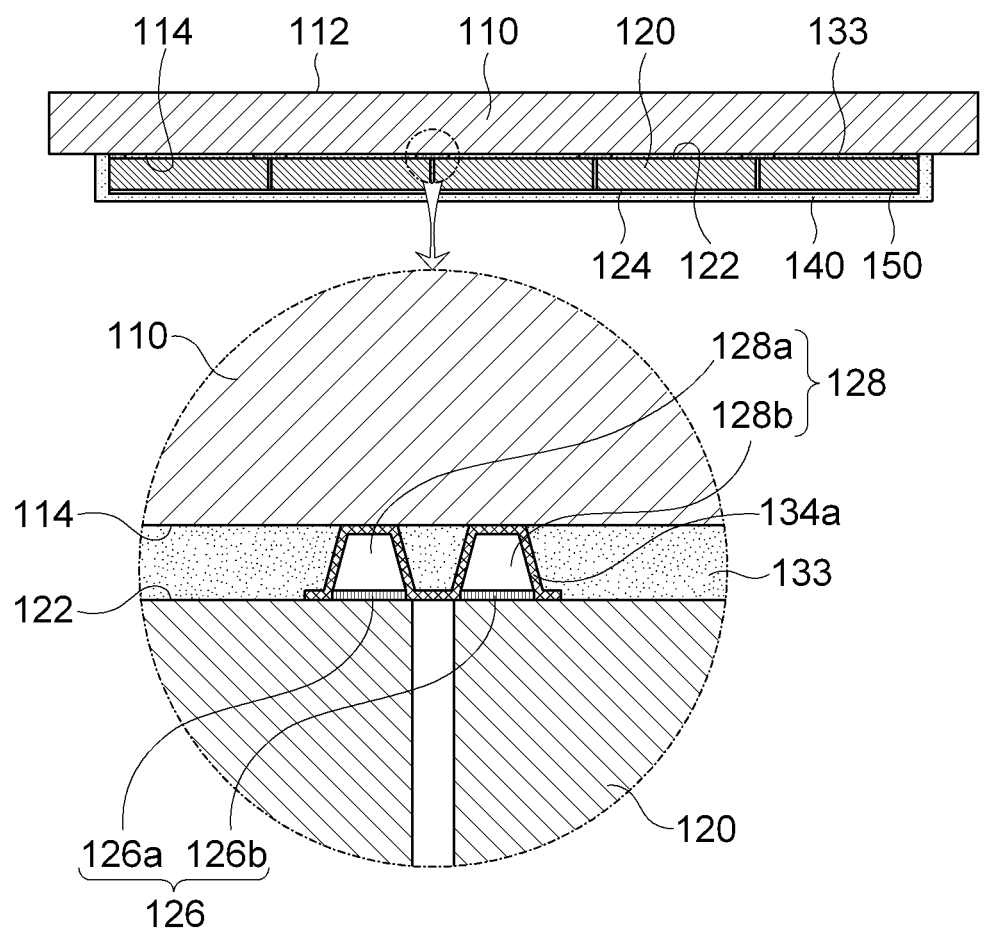
FIG. 2 is a view showing a solar cell module in accordance with an embodiment of the present invention.

FIG. 2 is a view showing a solar cell module in accordance with an embodiment of the present invention. Referring to FIG. 2, a solar cell module 100 may include a light transmitting plate 110, solar cells 120, a first adhesive film 133, and a molding film 140.

The light transmitting plate 110 may be made of a light transmitting material. As one example, the light transmitting plate 110 may include transparent glass having light transmittance. The transparent glass may be tempered glass. The light transmitting plate 110 may have an exposed surface 112 and an unexposed surface 114 opposite to the exposed surface 112 when being provided in an electronic device such as a mobile device. The light transmitting plate 110 is exposed outside the electronic device to be used as a medium for introducing external light into the solar cells 120 as well as to protect the solar cell module 100 from external environment.

The solar cells 120 may be bonded to the light transmitting plate 110 with the first adhesive film 133 interposed therebetween. Each of the solar cells 120 may have a light receiving surface 122 and a non-light receiving surface 124. The light receiving surface 122 may be a surface which receives light. The non-light receiving surface 124 may be a surface opposite to the light receiving surface 122. A bonding pad 126 may be disposed in an edge region of the light receiving surface 122. The bonding pad 126 may be a metal pad which is electrically connected to a positive or negative electrode of the solar cell 120.

The solar cell 120 may further include a conductive bump 128 bonded to the bonding pad 126. The conductive bump 128 may be a metal body for electrically connecting the solar cells 120. As one example, a stud bump may be used as the conductive bump 128. In case that the conductive bump 128 is a stud bump, the conductive bump 128 may have a shape of a column or a horn whose cross section becomes smaller as going away from the solar cell 120. As another example, a solder ball may be used as the conductive bump 128.

The conductive bumps 128 having the above structure may have a structure inserted in the first adhesive film 133. For example, the conductive bumps 128 may be provided in the first adhesive film 133 by being forcibly inserted in the first adhesive film 133 with a conductive pad 134a interposed therebetween. In this case, the conductive bumps 128 are surrounded by the conductive pad 134a as well as embedded in the first adhesive film 133. Accordingly, since the conductive pad 134a is configured to surround all exposed portions of the conductive bumps 128, a bonding area between the conductive pad 134a and the conductive bumps 128 can be increased.

Here, the conductive pad 134a may be made of a material having high electrical conductivity for effective electrical connection of the conductive bumps 128. As one example, the conductive pad 134a may be made of at least one metal material among Au, Ag, Ni, In, Zn, Ti, Cu, Cr, Ta, W, Pt, Fe, and Co.

Meanwhile, the solar cells 120 may be disposed on the light transmitting plate 110 to be electrically connected to each other in series. For example, the bonding pad 126 may include a first bonding pad 126a connected to a positive electrode of one of the solar cells 120 and a second bonding pad 126b connected to a negative electrode of the other solar cell 120 adjacent to the one solar cell 120. At this time, the solar cells 120 may be disposed so that the first bonding pad 126a and the second bonding pad 126b are alternately positioned on the light transmitting plate 110. The conductive bumps 128 may include a first conductive bump 128a bonded to the first bonding pad 126a and a second conductive bump 128b bonded to the second bonding pad 126b. And, the conductive pad 134a may be configured to surround the first and second conductive bumps 128a and 128b so that the first bonding pad 126a and the second bonding pad 126b are electrically connected to each other. Accordingly, the solar cells 120 may be electrically connected in series by connecting the first conductive bump 128a and the second conductive bump 128b provided in the adjacent solar cells 120 through the conductive pad 134a.

The first adhesive film 133 may bond the light transmitting plate 110 and the solar cells 120. Here, it may be preferred that the first adhesive film 133 is made of a material having high light transmittance to introduce external light, which is incident through the light transmitting plate 110, into the solar cells 120 while minimizing loss of the external light.

The molding film 140 may protect the solar cells 120 and a conductive bonding film 132. For example, the molding film 140 may cover the unexposed surface 114 of the light transmitting plate 110 to seal the solar cells 120. By the molding film 140, the solar cells 120 may be sealed and protected from external environment. Meanwhile, since the molding film 140 is disposed on the non-light receiving surfaces 124 of the solar cells 120, the molding film 140 may not be required to be configured to transmit external light. Accordingly, the molding film 140 may be made of an opaque epoxy resin. Here, a light reflective film 150 may be interposed between the solar cells 120 and the molding film 140.

As described above, the solar cell module 100 in accordance with an embodiment of the present invention includes the conductive pad 134a which electrically connects the conductive bumps 128 of the adjacent solar cells 120, and the conductive pad 134a may have a structure surrounding the adjacent conductive bumps 128. In this case, since the conductive pad 134a, which electrically connects the conductive bumps 128 of the different solar cells 120, has a structure surrounding the conductive bumps 128, the bonding area between the conductive bumps 128 and the conductive pad 134a can be increased. Accordingly, the solar cell module 100 in accordance with the present invention can improve reliability of electrical connection of the solar cells 120 and bonding reliability of the light transmitting plate 110 and the solar cells 120 by increasing the bonding area between the conductive bumps 128 and the conductive pad 134a which electrically connects the conductive bumps 128 of the solar cells 120.

Further, the solar cell module 100 in accordance with an embodiment of the present invention may have a structure in which the light transmitting plate 110 and the solar cells 120 are bonded to each other with the thin film type first adhesive film 133 interposed therebetween. Accordingly, the solar cell module 100 in accordance with the present invention may have a structure with improved integration by minimizing an interval between the light transmitting plate 110 and the solar cells 120.

Further, the solar cell module 100 in accordance with an embodiment of the present invention may have a structure in which the conductive bumps 128 bonded to the solar cells 120 are electrically connected by using the conductive pad 134a disposed on the first adhesive film 133. Accordingly, the solar cell module 100 in accordance with the present invention can have a structure with improved integration by minimizing an installation space of a component for electrically connecting the solar cells 120 in comparison with a case using a component such as a bonding wire.

Continuously, a method of manufacturing a solar cell module in accordance with an embodiment of the present invention will be described in detail. Here, a repeated description of the above-described solar cell module 100 will be omitted or simplified.

Figure 3:
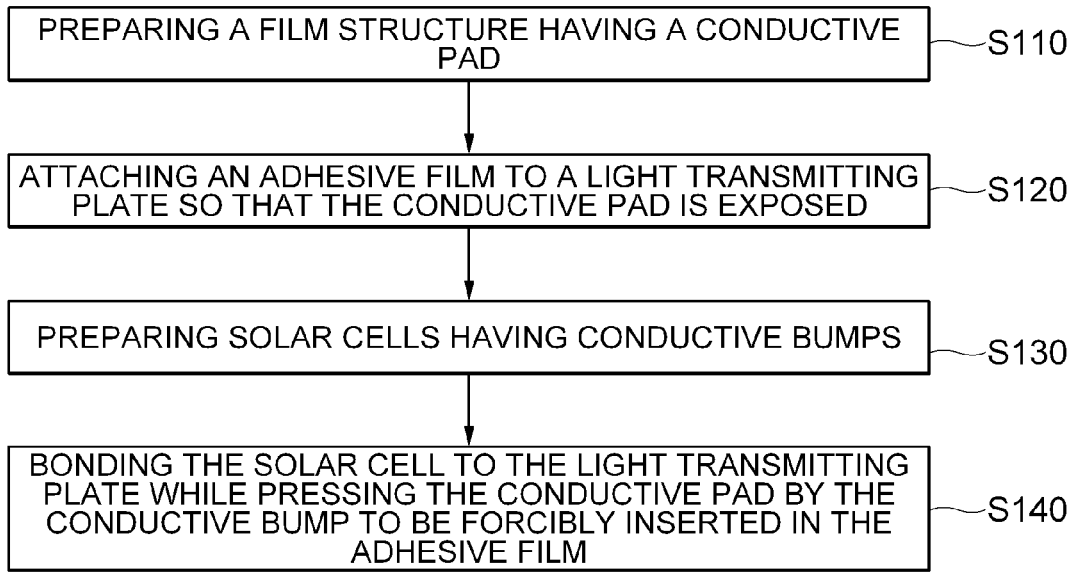
FIG. 3 is a flow chart showing a method of manufacturing a solar cell module in accordance with an embodiment of the present invention.

FIG. 3 is a flow chart showing a method of manufacturing a solar cell module in accordance with an embodiment of the present invention. And, FIGS. 4 to 8 are views for explaining a process of manufacturing a solar cell module in accordance with an embodiment of the present invention.

Figure 4:
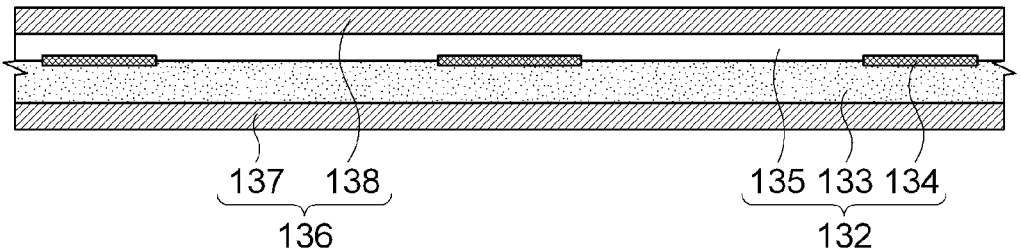
FIGS. 4 to 8 are views for explaining a process of manufacturing a solar cell module in accordance with an embodiment of the present invention.

Referring to FIGS. 3 and 4, a film structure 130 having a conductive pad 134 may be prepared S110. First, an adhesive film 132 may be prepared. The step of preparing the adhesive film 132 may include the steps of preparing a first adhesive film 133 having light transmittance, disposing a conductive pad 134 on the first adhesive film 133, and attaching a second adhesive film 135 on the first adhesive film 133 to seal the conductive pad 134. Here, the first adhesive film 133 may be a transparent film having high light transmittance. And, the conductive pad 134 may be a metal pattern made of a material selected from various kinds of metal. For example, the conductive pad 134 may be made of a metal material including at least one of Cu, Ni, W, Co, Ag, and Au.

And, the adhesive film 132 may be covered and protected by a protective film 136. For example, the adhesive film 132 may be sealed from external environment by covering the first adhesive film 133 exposed to the outside with a first protective film 137 and covering the second adhesive film 135 exposed to the outside with a second protective film 138. Accordingly, the film structure 130, which consists of the adhesive film 132 and the protective film 136 covering the outside of the adhesive film 132, can be manufactured.

Meanwhile, the first adhesive film 133, the second adhesive film 135, the first protective film 137, and the second protective film 138 may be provided to have different adhesive strengths. For example, adhesive strength between the second adhesive film 135 and the second protective film 138 may be greater than adhesive strength between the first adhesive film 133 and the second adhesive film 135. Accordingly, the second adhesive film 135 can be selectively separated from the first adhesive film 133 by separating the second protective film 138 from the film structure 130. Further, the adhesive force between the first adhesive film 133 and the second adhesive film 135 may be greater than adhesive strength between the first adhesive film 133 and the first protective film 137. Accordingly, in case of separating the first protective film 137 from the film structure 130, only the first protective film 137 can be separated from the first adhesive film 133 without separation of the first adhesive film 133 and the second adhesive film 135.

Figure 5:
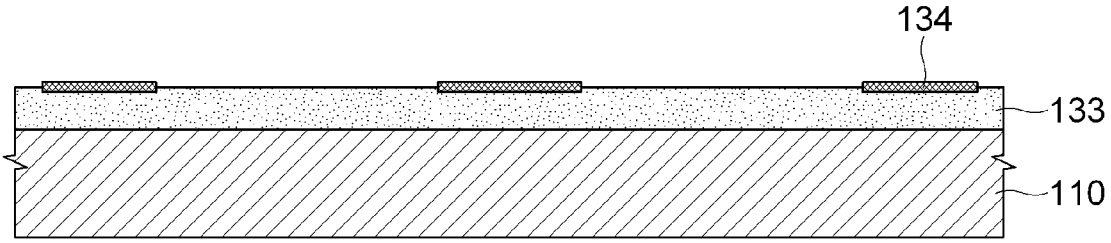

Referring to FIGS. 3 and 5, the adhesive film 132 may be attached to a light transmitting plate 110 so that a conductive pad 134 is exposed S120. For example, the first adhesive film 133 may be attached to the light transmitting plate 110 after separating the first protective film 137 from the film structure 130 to expose the first adhesive film 133. And, the second adhesive film 135 may be separated from the first adhesive film 133 to expose the conductive pad 134. At this time, the step of separating the second adhesive film 135 may be performed by separating the second protective film 138 from the film structure 130.

Through the above process, the first adhesive film 133 and the conductive pad 134 disposed on the first adhesive film 133 can be disposed on the light transmitting plate 110.

Figure 6:
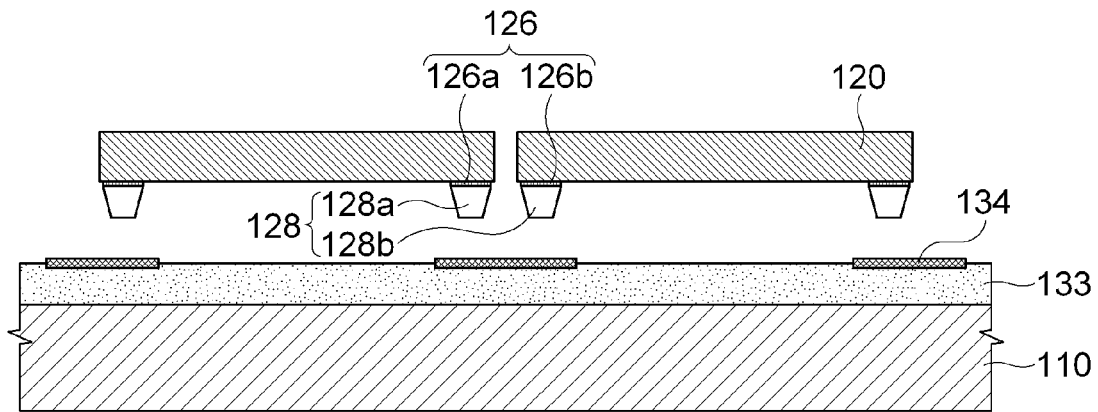

Referring to FIGS. 3 and 6, solar cells 120 having conductive bumps 128 may be prepared S130. First, the solar cells 120 having bonding pads 126 may be manufactured. At this time, the bonding pad 126 may consist of a first bonding pad 126a connected to a positive electrode of one of the solar cells 120 and a second bonding pad 126b connected to a negative electrode of the other solar cell 120 adjacent to the one solar cell 120. The bonding pad 126 may include a circuit pattern of the solar cell 120 such as a bus-bar.

And, a first conductive bump 128a may be bonded to the first bonding pad 126a, and a second conductive bump 128b may be bonded to the second bonding pad 126b. Various kinds of bumps may be used as the conductive bump 128. As one example, a stud bump may be used as the conductive bump 128. As another example, a solar ball may be used as the conductive bump 128.

Figure 7:
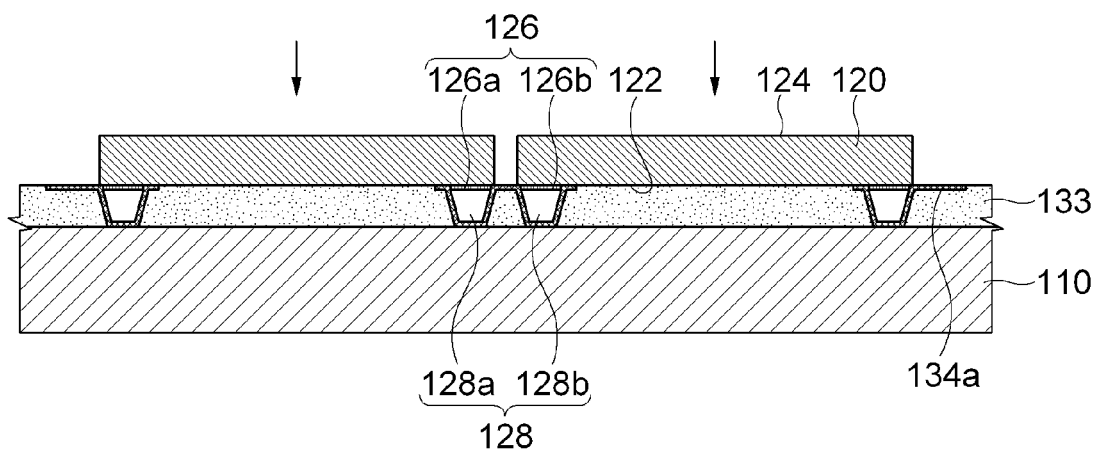

Referring to FIGS. 3 and 7, the solar cell 120 may be bonded to the light transmitting plate 110 while pressing the conductive pad 134 by the conductive bump 128 to be forcibly inserted in the adhesive film 132 S140. For example, a plurality of solar cells 120 may be disposed on the same plane in parallel. At this time, the solar cells 120 may be aligned so that the first conductive bump 128a bonded to the first bonding pad 126a of one solar cell 120 is adjacent to the second conductive bump 128b bonded to the second bonding pad 126b of the other solar cell 120. And, the solar cells 120 may be aligned so that the adjacent first and second conductive bumps 128a and 128b face one conductive pad 134.

And, the solar cells 120 may be attached to the light transmitting plate 110 while forcibly inserting the first and second conductive bumps 128a and 128b in one conductive pad 134. Accordingly, the light transmitting plate 110 and the solar cells 120 may be bonded to each other with the first adhesive film 133 interposed therebetween. In addition, the adjacent first and second conductive bumps 128a and 128b may be forcibly inserted in the first adhesive film 133 while pressing one conductive pad 134. Accordingly, the conductive pad 134 can be formed into a conductive pad 134a having a structure for electrically connecting the adjacent first and second conductive bumps 128a and 128b while surrounding all exposed portions of the adjacent first and second first and second conductive bumps 128a and 128b.

Meanwhile, a shape of the conductive bumps 128 may be adjusted so that the conductive bumps 128 can be easily forcibly inserted in the first adhesive film 133. For this, stud bumps can be used as the conductive bumps 128. In case that the conductive bumps 128 are stud bumps, the conductive bumps 128 may have a shape of at least one of a column and a horn whose cross section becomes smaller as going away from the solar cell 120. The conductive bumps 128 having this column or horn shape can be easily inserted in the first adhesive film 133.

Further, in a process of bonding the solar cells 120 to the light transmitting plate 110, the conductive bumps 128 may be used as stoppers for stopping relative movement of the light transmitting plate 110 and the solar cells 120. For example, the light transmitting plate 110 and the solar cells 120 are closely adhered to each other with the first adhesive film 133 interposed therebetween, and the relative movement of the light transmitting plate 110 and the solar cells 120 may have to be limited so that an interval between the light transmitting plate 110 and the solar cells 120 is equal to a thickness of the first adhesive film 133. Accordingly, a total height of the conductive bumps 128 and the conductive pad 134a can be adjusted to be substantially equal to a predetermined interval between the light transmitting plate 110 and the solar cells 120. In this case, in the process of bonding the light transmitting plate 110 and the solar cells 120, the conductive bumps 128 can stop the relative movement of the light transmitting plate 110 and the solar cells 120 at a time when the interval between the light transmitting plate 110 and the solar cells 120 is equal to the predetermined interval.

Through the above processes, a solar cell module 100 in which the plurality of solar cells 120 connected in series by the conductive pad 134a are disposed on the light transmitting plate 110 can be manufactured.

Figure 8:
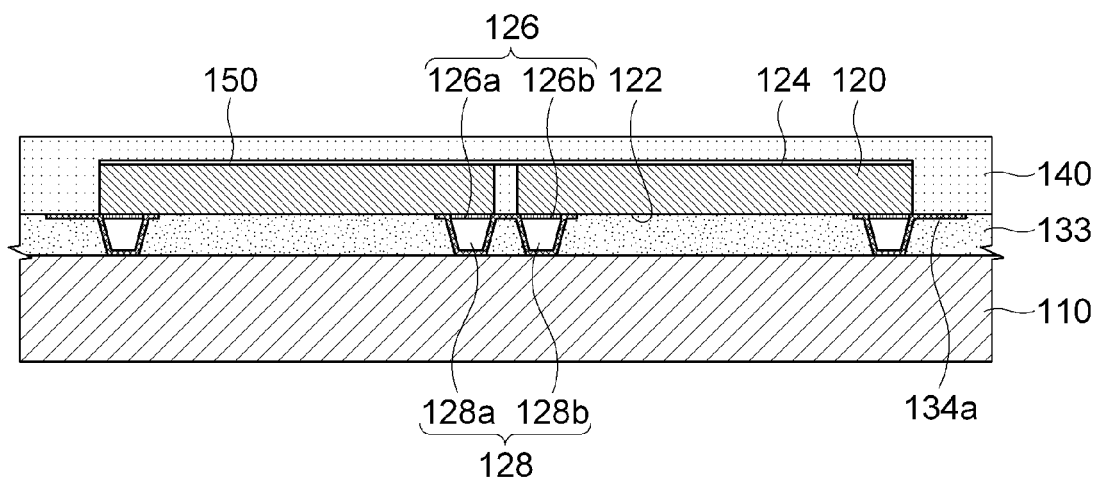

Referring to FIGS. 3 and 8, a molding film 140 may be formed to cover the solar cells 120 S140. The step of forming the molding film 140 may include the step of forming a resin film to cover non-light receiving surfaces 124 of the solar cells 120. At this time, an opaque epoxy resin may be used as the molding film 140. Here, before forming the molding film 140, the step of forming a light reflective film 150 which covers the non-light receiving surfaces 124 of the solar cells 120 may be further added.

As described above, the method of manufacturing a solar cell module in accordance with an embodiment of the present invention can attach the solar cell 120 to the light transmitting plate 110 with the first adhesive film 133 interposed therebetween while forcibly inserting the conductive bump 128 bonded to the solar cell 120 in the conductive pad 134a after attaching the first adhesive film 133 to the light transmitting plate 110 so that the conductive pad 134a is exposed. Accordingly, the method of manufacturing a solar cell module in accordance with the present invention can manufacture the solar cell module 100 capable of improving reliability of electrical connection between the solar cells 120 since one conductive pad 134a surrounds and electrically connects the adjacent conductive bumps 128.

The method of manufacturing a solar cell module in accordance with an embodiment of the present invention can manufacture the solar cell module 100 having a structure in which the light transmitting plate 110 and the solar cells 120 are bonded to each other with the thin film type first adhesive film 133 disposed on the light transmitting plate 110. Accordingly, the method of manufacturing a solar cell module can manufacture the solar cell module 100 capable of improving bonding reliability of the solar cell 120 to the light transmitting plate 110 by closely bonding the entire surface of the film structure 130 of the light transmitting plate 110 and the non-light receiving surface 124 of the solar cell 120.

The method of manufacturing a solar cell module in accordance with an embodiment of the present invention can manufacture the solar cell module 100 having a structure in which the light transmitting plate 110 and the solar cells 120 are bonded to each other with the thin film type first adhesive film 133 interposed therebetween. Accordingly, the method of manufacturing a solar cell module in accordance with an embodiment of the present invention can manufacture the solar cell module 100 with improved integration by minimizing the interval between the light transmitting plate 110 and the solar cells 120.

Hereinafter, a mobile apparatus and a method of manufacturing the same will be described in detail. Here, repeated descriptions of the above-described solar cell module and the method of manufacturing the same will be omitted or simplified.

Figure 9:
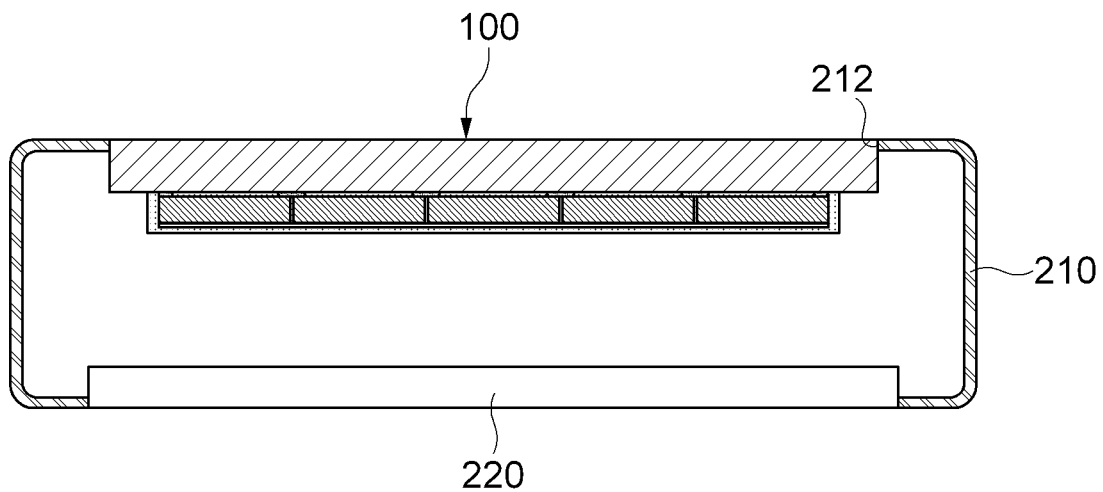
FIG. 9 is view showing a mobile apparatus with a solar cell module in accordance with an embodiment of the present invention.

FIG. 9 is a view showing a mobile apparatus with a solar cell module in accordance with an embodiment of the present invention. Referring to FIG. 9, a mobile apparatus 200 may include a case 210 in which the above-described solar cell module 100 is disposed and a display unit 220 which displays images to the outside.

An opening 212 may be provided at one side of the case 210 to install the solar cell module 100 therein. For example, the opening 212 may mount and fix a light transmitting plate 110 of the solar cell module 100. Accordingly, the solar cell module can be mounted to the case 210 by inserting the light transmitting plate 110 in the opening 212.

The light transmitting plate 110 is exposed to the outside, and external light can be incident on solar cells 120 through the light transmitting plate 110. Here, since the light transmitting plate 110 is exposed to the outside, it may be provided to have enough strength to protect the solar cell module 100 from external shocks. In addition, the light transmitting plate 110 introduces the external light into the solar cells 120 while minimizing loss of the external light.

The display unit 220 may be disposed at the other side of the case 210. The display unit 220 may be configured to display electronic information to the outside so that a user of the mobile apparatus 200 can recognize the electronic information. For this, the display unit 220 may include one of various kinds of flat panel display devices.

The mobile apparatus 200 having the above structure may include the case 210 having the opening 212 through which light is incident and the solar cell module 100 having the light transmitting plate 110 which seals the opening 212. Accordingly, the mobile apparatus 200 in accordance with the present invention can manufacture the mobile apparatus 200 only by components of the solar cell module 100 without separate tempered glass by directly mounting the light transmitting plate 110 of the solar cell module 100 to the case 210 of the mobile apparatus 200 and using the light transmitting plate 110 as a protective film for protection from external environment.

Meanwhile, one example of a method of manufacturing the mobile apparatus 200 is as follows. A method of manufacturing a mobile apparatus in accordance with an embodiment of the present invention may include the steps of preparing a case 210 having an opening 212, preparing a solar cell module 100 having solar cells 120 attached to a light transmitting plate 110 with a first adhesive film 133 of FIG. 2 interposed therebetween, and mounting the solar cell module 100 to the opening 212 of the case 210 so that the opening 212 is sealed by the light transmitting plate 110. Accordingly, the method of manufacturing a mobile apparatus in accordance with the present invention can improve integration and manufacturing efficiency of the mobile apparatus 200 by directly mounting the light transmitting plate 110 of the solar cell module 100 to the case 210 of the mobile apparatus 200 and using the light transmitting plate 110 as a protective film for protection from external environment.

As can be seen from the foregoing, a solar cell module and a mobile apparatus with the same in accordance with the present invention may include a conductive pad which electrically connects conductive bumps of adjacent solar cells, and the conductive pad may have a structure surrounding the conductive bumps. Accordingly, the solar cell module and the mobile apparatus with the same in accordance with the present invention can improve reliability of electrical connection between the solar cells by increasing a bonding area between the adjacent conductive bumps and the conductive pad.

The solar cell module and the mobile apparatus with the same in accordance with the present invention may bond a light transmitting plate and the solar cells with an adhesive film interposed therebetween, and light receiving surfaces of the solar cells are attached to the entire surface of the adhesive film. Accordingly, the solar cell module and the mobile apparatus with the same in accordance with the present invention can improve bonding reliability of the solar cells to the light transmitting plate.

The solar cell module and the mobile apparatus with the same in accordance with an embodiment of the present invention may bond the light transmitting plate and the solar cells with the thin film type adhesive film interposed therebetween. Accordingly, the solar cell module and the mobile apparatus with the same in accordance with the present invention can have a structure with improved integration by minimizing an interval between the light transmitting plate and the solar cells.

A method of manufacturing a solar cell module in accordance with an embodiment of the present invention may attach solar cells to a light transmitting plate with an adhesive film interposed therebetween while forcibly inserting conductive bumps bonded to the solar cells in a conductive pad after attaching the adhesive film to the light transmitting plate so that the conductive pad is exposed. Accordingly, the method of manufacturing a solar cell module in accordance with the present invention can manufacture a solar cell module capable of improving reliability of electrical connection between the solar cells by surrounding and electrically connecting the adjacent conductive bumps through one conductive pad.

The method of manufacturing a solar cell module in accordance with the present invention can manufacture the solar cell module in which the light transmitting plate and the solar cells are bonded to each other with the thin film type adhesive film disposed on the light transmitting plate. Accordingly, the method of manufacturing a solar cell module in accordance with the present invention can manufacture a solar cell module capable of improving bonding reliability of the solar cell to the light transmitting plate.

The method of manufacturing a solar cell module in accordance with an embodiment of the present invention can manufacture the solar cell module in which the light transmitting plate and the solar cells are bonded to each other with the thin film type adhesive film disposed therebetween. Accordingly, the method of manufacturing a solar cell module in accordance with the present invention can manufacture a solar cell module with improved integration by minimizing an interval between the light transmitting plate and the solar cells.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A solar cell module, comprising:
   a light transmitting plate having light transmittance;
   a plurality of solar cells each having a light receiving surface configured to receive light through the light transmitting plate and a non-light receiving surface opposite to the light receiving surface;
   the plurality of solar cells each having bonding pads at respective edge portions and conductive bumps respectively bonded to the bonding pads;
   an adhesive film disposed between the light transmitting plate and the solar cells to bond the light transmitting plate and the solar cells; and
   a conductive pad inserted in the adhesive film and covering top and side surfaces of two conductive bumps of adjacent solar cells, the conductive pad electrically connecting the two conductive bumps of adjacent solar cells, wherein the conductive pad follows the contour of the top and side surfaces of the two conductive bumps of the adjacent solar cells, and extends continuously over the two conductive bumps from one of the adjacent solar cells to the other, the two conductive bumps and the conductive pad are combined to directly and electrically connect adjacent solar cells in series, and the conductive bump defines a spacer for maintaining an interval between a surface of the light transmitting plate and surfaces of the solar cells, wherein the surface of the light transmitting plate and the surfaces of the solar cells face each other, wherein the interval is equal to a total height of the conductive pad, the conductive bump, and the bonding pad.

2. The solar cell module according to claim 1, wherein the bonding pads comprise:
   a first bonding pad connected to a positive electrode of one of the solar cells; and
   a second bonding pad connected to a negative electrode of the other solar cell adjacent to the one solar cell,
the conductive bumps comprise:
   a first conductive bump bonded to the first bonding pad; and
   a second conductive bump bonded to the second bonding pad, and
the conductive pad electrically connects the first conductive bump and the second conductive bump.

3. The solar cell module according to claim 1, wherein the conductive bump comprises a stud bump.

4. The solar cell module according to claim 1, wherein the conductive bump has a shape of at least one of a column and a horn with a cross section that becomes smaller as the conductive bump extends away from the solar cells, the cross section cut in a direction perpendicular to a plane of the solar cell module.

5. The solar cell module according to claim 1, wherein the solar cell module further comprises a light reflective film which covers the non-light receiving surface.

6. The solar cell module according to claim 5, wherein
the light transmitting plate comprises an exposed surface exposed to the outside and an unexposed surface facing the light receiving surfaces of the solar cells, and
the solar cell module further comprises a molding film which covers the unexposed surface to seal the solar cells.

7. The solar cell module according to claim 6, wherein the molding film is made of an opaque material.

8. A mobile apparatus, comprising:
a case having an opening at one side;
a display unit disposed at the other side of the case for displaying information to the outside; and
a solar cell module disposed in the case for receiving and converting external light into electric energy, wherein the solar cell module comprises:
   a light transmitting plate provided in the opening to seal the opening and having light transmittance;
   a plurality of solar cells each having a light receiving surface configured to receive light through the light transmitting plate and a non-light receiving surface opposite to the light receiving surface;
   the plurality of solar cells each having bonding pads at respective edge portions and conductive bumps respectively bonded to the bonding pads;
   an adhesive film disposed between the light transmitting plate and the solar cells to bond the light transmitting plate and the solar cells; and
   a conductive pad inserted in the adhesive film and covering top and side surfaces of two conductive bumps of adjacent solar cells, the conductive pad electrically connecting the two conductive bumps of adjacent solar cells, wherein
the conductive pad follows the contour of the top and side surfaces of the two conductive bumps of the adjacent solar cells, and extends continuously over the two conductive bumps from one of the adjacent solar cells to the other,
the two conductive bumps and the conductive pad are combined to directly and electrically connect adjacent solar cells in series, and
the conductive bump defines a spacer for maintaining an interval between a surface of the light transmitting plate and surfaces of the solar cells, wherein the surface of the light transmitting plate and the surfaces of the solar cells face each other, wherein the interval is equal to a total height of the conductive pad, the conductive bump, and the bonding pad.

9. The mobile apparatus according to claim 8, wherein the light transmitting plate comprises transparent glass which is exposed outside the case for introducing the external light into the solar cells.

10. The mobile apparatus according to claim 8, wherein the bonding pads comprise:
   a first bonding pad connected to a positive electrode of one of the solar cells; and
   a second bonding pad connected to a negative electrode of the other solar cell adjacent to the one solar cell,
the conductive bumps comprise:
   a first conductive bump bonded to the first bonding pad; and
   a second conductive bump bonded to the second bonding pad, and
the conductive pad electrically connects the first conductive bump and the second conductive bump.

11. The mobile apparatus according to claim 8, wherein the conductive bump has a shape of at least one of a column and a horn with a cross section that becomes smaller as the conductive bump extends away from the solar cells, the cross section cut in a direction perpendicular to a plane of the solar cell module.

12. The solar cell module according to claim 1, wherein the conductive pad is in direct physical and electrical contact with the top and side surfaces of the conductive bumps of the adjacent solar cells.

\* \* \* \* \*